(12) United States Patent
Kuno et al.

(10) Patent No.: US 12,451,334 B2
(45) Date of Patent: Oct. 21, 2025

(54) WAFER PLACEMENT TABLE

(71) Applicant: NGK Insulators, Ltd., Nagoya (JP)

(72) Inventors: Tatsuya Kuno, Nagoya (JP); Seiya Inoue, Handa (JP)

(73) Assignee: NGK INSULATORS, LTD., Nagoya (JP)

( * ) Notice: Subject to any disclaimer, the term of this patent is extended or adjusted under 35 U.S.C. 154(b) by 525 days.

(21) Appl. No.: 17/819,670

(22) Filed: Aug. 15, 2022

(65) Prior Publication Data

US 2023/0146001 A1    May 11, 2023

(30) Foreign Application Priority Data

Nov. 8, 2021   (JP) ................. 2021-181625

(51) Int. Cl.
*H01J 37/32*      (2006.01)
*H01L 21/683*     (2006.01)

(52) U.S. Cl.
CPC ... *H01J 37/32642* (2013.01); *H01J 2237/002* (2013.01); *H01L 21/6833* (2013.01)

(58) Field of Classification Search
CPC ........... H01J 37/32642; H01J 37/32715; H01J 37/32724; H01J 2237/002;

(Continued)

(56) References Cited

U.S. PATENT DOCUMENTS

2005/0101082 A1   5/2005  Yokoyama et al.
2007/0223173 A1*  9/2007  Fujisawa ............. H01L 21/6833
                                                        361/234

(Continued)

FOREIGN PATENT DOCUMENTS

JP   2014-150104 A   8/2014
JP   6080571 B2      2/2017

(Continued)

OTHER PUBLICATIONS

Taiwanese Office Action (Application No. 111140151) dated Oct. 3, 2023 (5 pages).

(Continued)

*Primary Examiner* — Kevin J Comber
(74) *Attorney, Agent, or Firm* — BURR PATENT LAW, PLLC

(57) ABSTRACT

A wafer placement table includes a central ceramic base that has an upper surface including a wafer placement surface, an outer circumferential ceramic base that has an upper surface including a focus ring placement surface, and a cooling base that includes a central portion, an outer circumferential portion, and a coupler that couples the central portion and the outer circumferential portion with each other. The cooling base has a central refrigerant flow path that is formed in the central portion and an outer circumferential refrigerant flow path that is formed in the outer circumferential portion. The coupler has an upward groove that open from an upper surface and that have an annular shape, and a downward groove that opens from a lower surface, that have a ceiling surface higher than a bottom surface of the upward groove, and that have an annular shape.

6 Claims, 6 Drawing Sheets

(58) Field of Classification Search
CPC ......... H01L 21/68785; H01L 21/67109; H01L 21/6831; H01L 21/67103; H01L 21/683; H01L 21/68757; H01L 21/6833
USPC .......................................................... 361/234
See application file for complete search history.

(56) References Cited

U.S. PATENT DOCUMENTS

| | | | |
|---|---|---|---|
| 2010/0326957 A1* | 12/2010 | Maeda .................... | H01J 37/20 156/345.26 |
| 2014/0209245 A1 | 7/2014 | Yamamoto et al. | |
| 2015/0373783 A1 | 12/2015 | Kitagawa | |
| 2016/0198528 A1* | 7/2016 | Kitagawa .......... | H01L 21/67109 156/345.52 |
| 2017/0229329 A1* | 8/2017 | Benjaminson .... | H01L 21/68785 |
| 2021/0175109 A1 | 6/2021 | Sato et al. | |

FOREIGN PATENT DOCUMENTS

| | | |
|---|---|---|
| JP | 6442296 B2 | 12/2018 |
| JP | 6452449 B2 | 1/2019 |
| JP | 6741461 B2 | 8/2020 |
| KR | 10-2005-0040114 A | 5/2005 |
| KR | 10-2018-0028400 A | 3/2018 |
| TW | 201635424 A | 10/2016 |
| TW | 202111859 A | 3/2021 |
| WO | 2017/024132 A1 | 2/2017 |

OTHER PUBLICATIONS

Chinese Office Action dated Oct. 22, 2024 (Application No. 202210788363.0).
Korean Office Action (with English translation) dated Mar. 15, 2024 (Application No. 10-2022-0101342).
Taiwanese Office Action (Application No. 111140151) dated May 27, 2024 (6 pages).

* cited by examiner

WAFER PLACEMENT TABLE

BACKGROUND OF THE INVENTION

1. Field of the Invention

The present invention relates to a wafer placement table.

2. Description of the Related Art

A wafer placement table has been used for performing CVD or etching on a wafer by using plasma. The wafer placement table includes an electrostatic chuck for attracting and securing a wafer to a wafer placement surface and a cooling base that cools the electrostatic chuck. In some cases, a focus ring is disposed on the outer circumference of the wafer placement surface. The focus ring is placed on a focus ring placement surface lower than the wafer placement surface and has a function of stably generating plasma toward an outer circumferential edge of the wafer and a function of controlling the temperature of the outer circumferential edge of the wafer. In some cases, a central refrigerant flow path for the wafer and an outer circumferential refrigerant flow path for the focus ring are formed in the cooling base in order to separately control the temperatures of the wafer placement surface and the focus ring placement surface, and the temperatures of refrigerant that flows through the respective refrigerant flow paths are separately adjusted. As for a known wafer placement table, an electrostatic chuck is divided into a central ceramic base that has a wafer placement surface and an outer circumferential ceramic base that has a focus ring placement surface, and a single upward groove that opens from an upper surface of a cooling base is formed into an annular shape so as to be along the boundary between the central ceramic base and the outer circumferential ceramic base (for example, PTL 1 to PTL 4).

CITATION LIST

Patent Literature

PTL 1: JP 6080571 B
PTL 2: JP 6452449 B
PTL 3: JP 6442296 B
PTL 4: JP 6741461 B

SUMMARY OF THE INVENTION

As for the cooling base that has the single upward groove described above, however, only the bottom of the upward groove corresponds to a heat-transfer path in a coupler that couples an outer circumferential portion and a central portion of the cooling base with each other, and accordingly, there is a possibility that the coupler is damaged when a thermal stress is applied to the bottom of the upward groove due to a difference in temperature between the outer circumferential portion and the central portion of the cooling base.

The present invention has been accomplished to solve the problem, and it is a main object of the present invention to prevent a wafer placement table that has a wafer placement surface and a focus ring placement surface and that has an integrated body from being damaged due to a thermal stress.

A wafer placement table according to the present invention includes a central ceramic base that has an upper surface including a wafer placement surface and that contains an electrode, an outer circumferential ceramic base that has an upper surface including a focus ring placement surface, that is disposed on an outer circumference of the central ceramic base, that is separated from the central ceramic base, and that has an annular shape, and a cooling base that includes a central portion that is joined to a lower surface of the central ceramic base, an outer circumferential portion that is joined to a lower surface of the outer circumferential ceramic base, and a coupler that couples the central portion and the outer circumferential portion with each other. The cooling base has a central refrigerant flow path that is formed in the central portion and an outer circumferential refrigerant flow path that is formed in the outer circumferential portion. The coupler is formed outside an outermost edge of the central refrigerant flow path and inside an innermost edge of the outer circumferential refrigerant flow path, and has one or more upward grooves that open from an upper surface, and that have an annular shape, and has one or more downward grooves that open from a lower surface, that have a ceiling surface higher than a bottom surface of the one or more upward grooves, and that have an annular shape.

The wafer placement table has not only the one or more upward grooves that open from the upper surface but also the one or more downward grooves that open from the lower surface, and the ceiling surface of the one or more downward grooves is higher than the bottom surface of the one or more upward grooves. Accordingly, the length of a heat-transfer path in the coupler between the central portion and the outer circumferential portion increases by that of a path in an up-down direction. Consequently, the temperature gradient of the coupler decreases, a thermal stress that is applied to the coupler is reduced, and accordingly, damage due to a thermal stress is reduced. The wafer placement table has the integrated body and is accordingly easier to handle than in the case where the central portion and the outer circumferential portion have separated bodies.

In the present specification, the words "up-down", "left-right", and "front-rear" are used to describe the present invention in some cases, but the words "up-down", "left-right", and "front-rear" merely represent relative positional relationships. For this reason, the word "up-down" is changed into the word "left-right" or the word "left-right" is changed into the word "up-down" in some cases where the direction of the wafer placement table is changed. These cases are also included in the technical scope of the present invention.

As for the wafer placement table according to the present invention, refrigerant may be separately supplied to the central refrigerant flow path and the outer circumferential refrigerant flow path. This enables the temperatures of the wafer placement surface that is located above the central refrigerant flow path and the focus ring placement surface that is located above the outer circumferential refrigerant flow path to be separately controlled.

As for the wafer placement table according to the present invention, the one or more upward grooves may be formed next to the central refrigerant flow path, the outer circumferential refrigerant flow path, or both, and the bottom surface of the one or more upward grooves may be flush with or lower than a bottom surface of the central refrigerant flow path and a bottom surface of the outer circumferential refrigerant flow path. Consequently, the bottom surface of the one or more upward grooves is located at a portion that is cooled by refrigerant and that has a stable temperature, and accordingly, damage due to a thermal stress is more effectively reduced than in the case where the bottom surface of the one or more upward grooves is located at a portion higher than that.

As for the wafer placement table according to the present invention, the coupler may have the single upward groove and the single downward groove. Consequently, the number of the upward groove and the number of the downward groove are minimized, and accordingly, process costs can be inhibited from increasing. A portion that can have no refrigerant flow paths can be reduced, and accordingly, the degree of freedom of the arrangement of the refrigerant flow paths can be increased.

As for wafer placement table according to the present invention, the coupler may have two of the upward grooves and the single downward groove, and the upward grooves and the downward groove may be alternately arranged. This enables the coupler to be longer than in the case where the number of the upward groove is one, and the number of the downward groove is one, and a thermal stress that is applied to the coupler can be reduced. The upward grooves are formed next to both of the central refrigerant flow path and the outer circumferential refrigerant flow path, and accordingly, the central portion and the outer circumferential portion can be coupled with each other at a lower portion that is cooled by the refrigerant and that has a relatively stable temperature unlike the case where a downward groove is formed next to one of these or both. For this reason, damage due to a thermal stress can be reduced.

As for the wafer placement table according to the present invention, the cooling base may be composed of a metal matrix composite material. The wafer placement table according to the present invention can reduce damage due to a thermal stress and is accordingly particularly effective for the case where a fragile material such as a metal matrix composite material is used. The cooling base composed of a metal matrix composite material has a linear thermal expansion coefficient close to that of a ceramic material of which the ceramic base is composed. Accordingly, when the ceramic base and the cooling base are joined to each other, it is not necessary to use a layer (for example, a resin joining layer) for relieving the effect of a difference in expansion coefficient between these, and a metal joining layer can be used. The thermal conductivity of the metal joining layer is higher than that of the resin joining layer, and accordingly, the ability to remove heat required for the case where a wafer is processed by using high power plasma can be acquired.

DETAILED DESCRIPTION OF THE INVENTION

Figure 1:
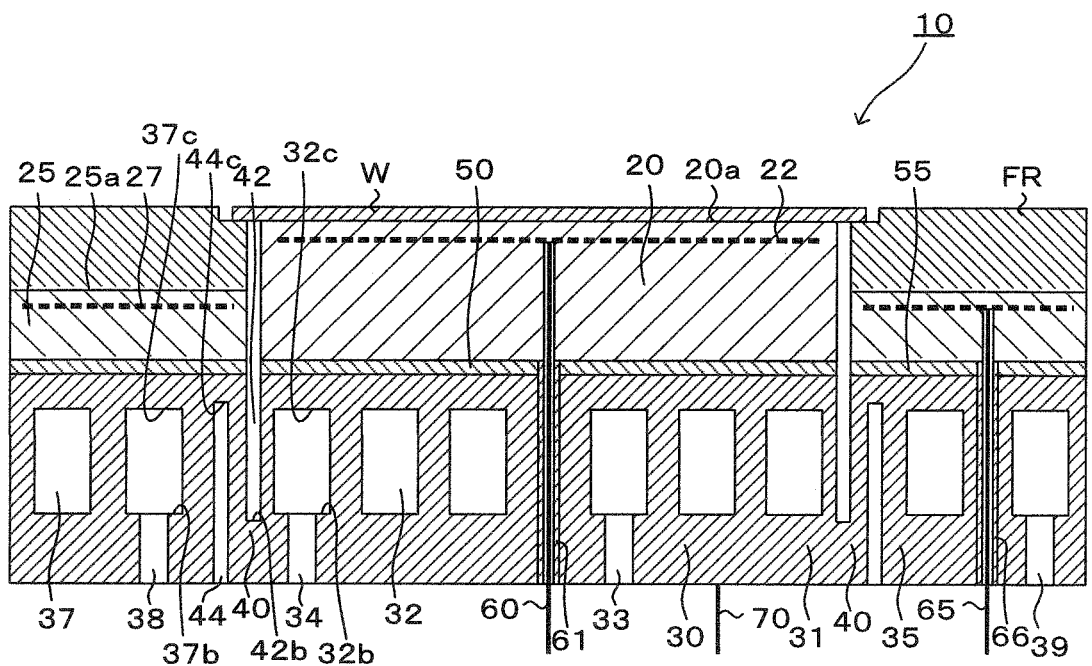
FIG. 1 is a vertical cross-sectional view of a wafer placement table 10.
Figure 2:
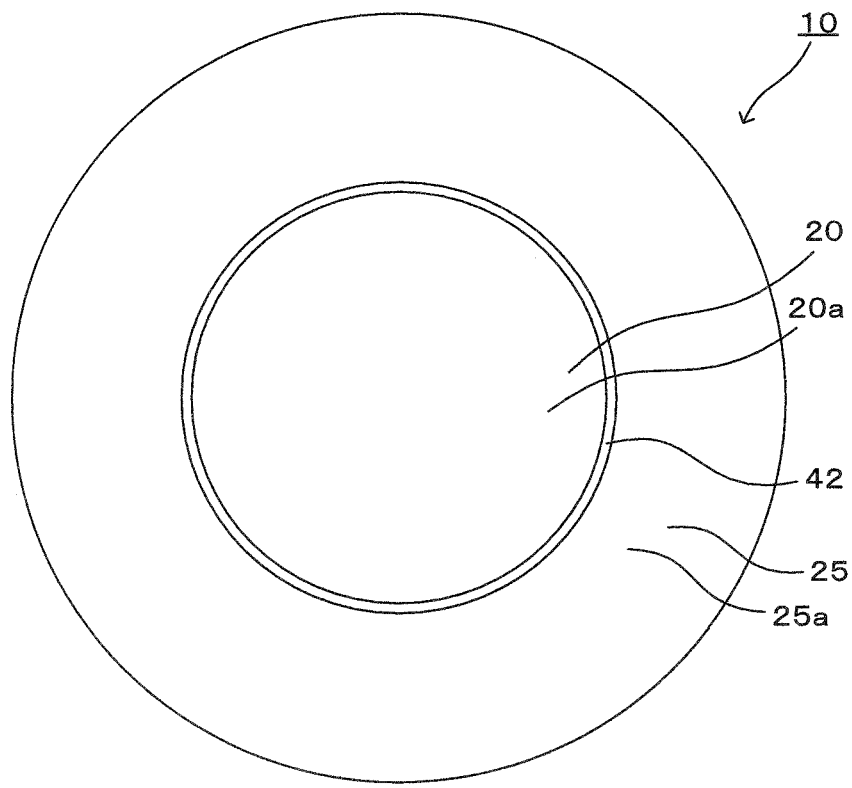
FIG. 2 is a plan view of the wafer placement table 10.
Figure 3:
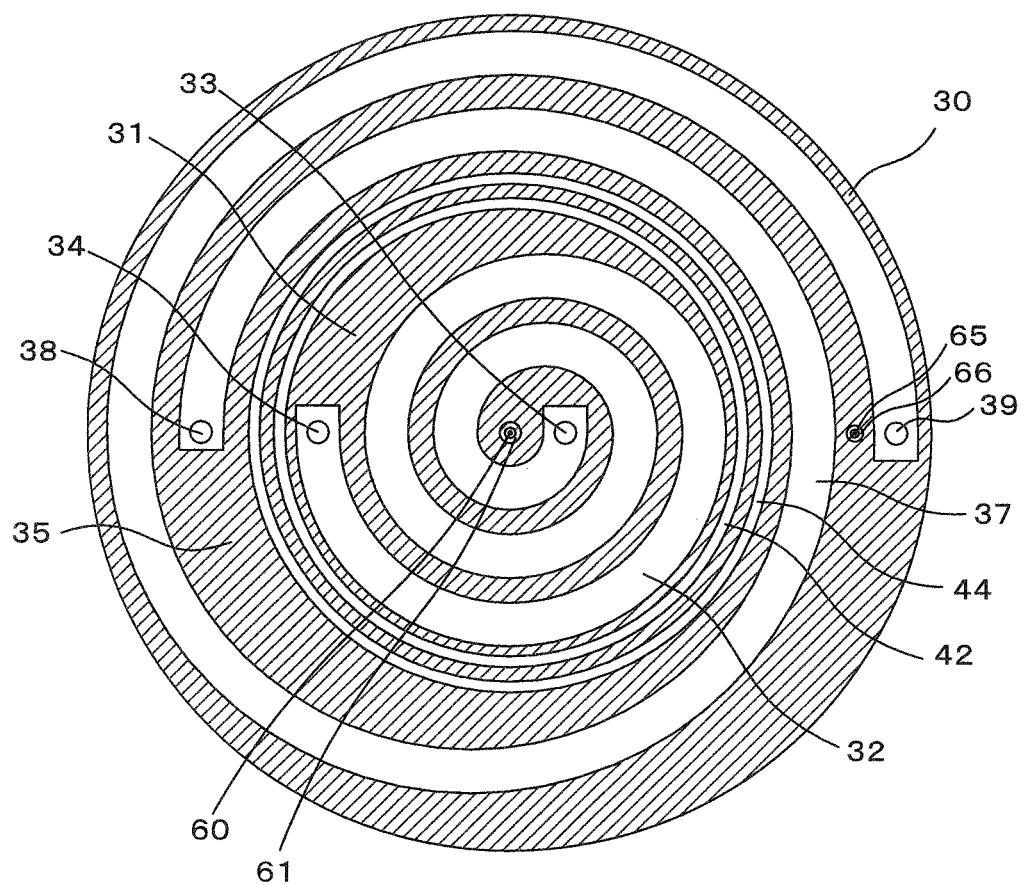
FIG. 3 is a cross sectional view of the wafer placement table 10.
Figure 4:
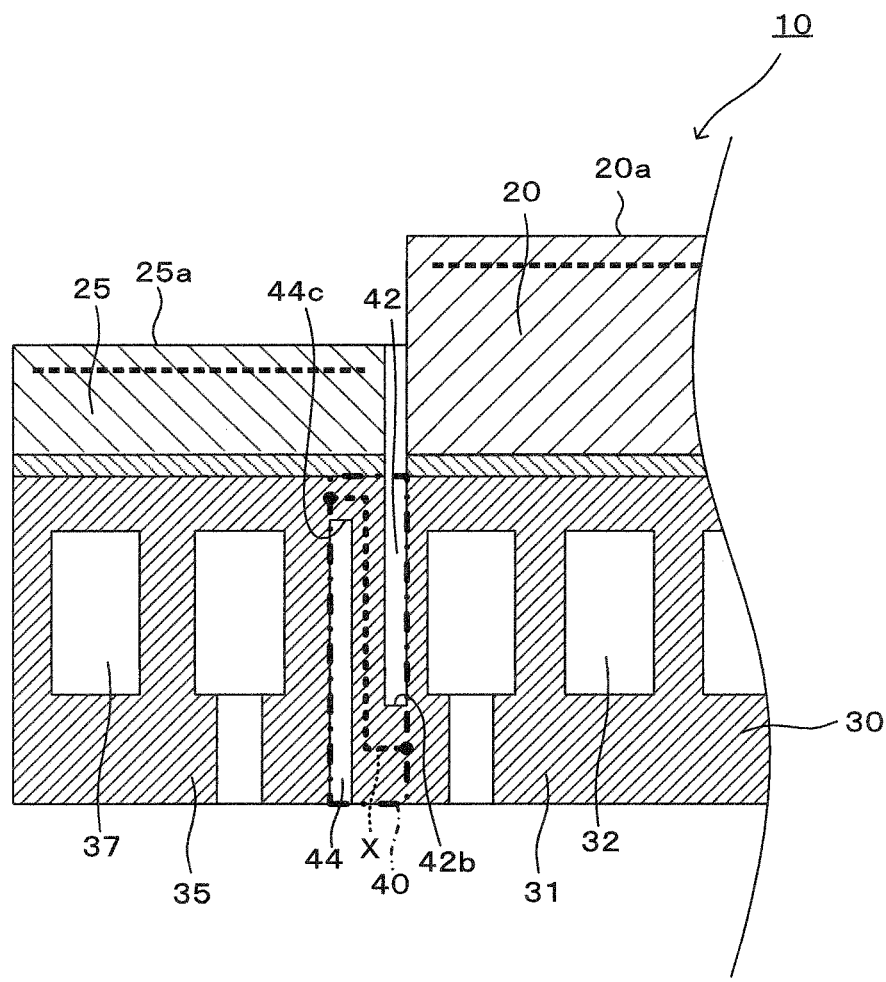
FIG. 4 illustrates a heat-transfer path X in a coupler 40 between a central portion 31 and an outer circumferential portion 35.

A preferred embodiment of the present invention will hereinafter be described with reference to the drawings. FIG. 1 is a vertical cross-sectional view (a sectional view taken along a plane containing the central axis of a wafer placement table 10) of the wafer placement table 10. FIG. 2 is a plan view of the wafer placement table 10. FIG. 3 is a cross sectional view (a sectional view of a section of the wafer placement table 10 taken along a horizontal plane that passes through refrigerant flow paths 32 and 37 when viewed from above) of the wafer placement table 10. FIG. 4 illustrates a heat-transfer path X in a coupler 40 between a central portion 31 and an outer circumferential portion 35.

The wafer placement table 10 is used to perform CVD or etching on a wafer W by using plasma. The wafer placement table 10 includes a central ceramic base 20, an outer circumferential ceramic base 25, and a cooling base 30. The central ceramic base 20 is joined to an upper surface of the cooling base 30 with a central joining layer 50 interposed therebetween, the outer circumferential ceramic base 25 is joined to the upper surface of the cooling base 30 with an outer circumferential joining layer 55 interposed therebetween, and the central ceramic base 20 and the outer circumferential ceramic base 25 constitute the wafer placement table 10 that has an integrated body.

The central ceramic base 20 is a disk-like plate composed of a ceramic material represented by, for example, alumna or aluminum nitride. The central ceramic base 20 has an upper surface including a wafer placement surface 20a on which the wafer W is to be placed. The central ceramic base 20 contains a central electrode 22 near the wafer placement surface 20a. The central electrode 22 is a single-pole electrostatic attraction electrode that has a circular plate or mesh shape and is composed of, for example, a material containing W, Mo, WC, and MoC. A layer in the central ceramic base 20 above the central electrode 22 functions as a dielectric layer. A direct current power supply, not illustrated, is connected to the central electrode 22 with a power supply terminal 60 interposed therebetween. The power supply terminal 60 extends beyond an insulating tube 61 that is disposed in a through-hole that extends through the cooling base 30 and the central joining layer 50 in an up-down direction and reaches the central electrode 22 via a lower surface of the central ceramic base 20.

The outer circumferential ceramic base 25 is an annular plate that is composed of a ceramic material represented by alumna or aluminum nitride. The outer circumferential ceramic base 25 has an upper surface including a focus ring placement surface 25a on which a focus ring FR is to be placed. The outer circumferential ceramic base 25 is disposed on the outer circumference of the central ceramic base 20. The focus ring placement surface 25a is lower than the wafer placement surface 20a. The outer circumferential ceramic base 25 contains an outer circumferential electrode 27 near the focus ring placement surface 25a. The outer circumferential electrode 27 is a single-pole electrostatic attraction electrode that has an annular plate or mesh shape and is composed of, for example, a material containing W, Mo, WC, and MoC. A layer in the outer circumferential ceramic base 25 above the outer circumferential electrode 27 functions as a dielectric layer. A direct current power supply, not illustrated, is connected to the outer circumferential electrode 27 with a power supply terminal 65 interposed therebetween. The power supply terminal 65 extends beyond an insulating tube 66 that is disposed in a through-hole that extends through the cooling base 30 and the outer circumferential joining layer 55 in the up-down direction and reaches the outer circumferential electrode 27 via a lower surface of the outer circumferential ceramic base 25.

The cooling base 30 is a disk-like member composed of a metal matrix composite material (also referred to as a metal matrix composite (MMC)). The cooling base 30 contains the central refrigerant flow path 32 and the outer circumferential refrigerant flow path 37 through which refrigerant can circulate. The central refrigerant flow path 32 has a spiral shape that extends from an inlet 33 to an outlet 34 across the entire central ceramic base 20. The inlet 33 and the outlet 34 of the central refrigerant flow path 32 are connected to a central refrigerant cooling device not illustrated. The refrigerant that is discharged via the outlet 34 returns to the inlet 33 after temperature is adjusted by the central refrigerant cooling device and is supplied to the central refrigerant flow path 32. The outer circumferential refrigerant flow path 37 has a spiral shape that extends from an inlet 38 to an outlet 39 across the entire outer circumferential ceramic base 25. The inlet 38 and the outlet 39 of the outer circumferential refrigerant flow path 37 are connected to an outer circumferential refrigerant cooling device that differs from the central refrigerant cooling device and that is not illustrated. The refrigerant that is discharged via the outlet 39 returns to the inlet 38 after temperature is adjusted by the outer circumferential refrigerant cooling device and is supplied to the outer circumferential refrigerant flow path 37. The central refrigerant flow path 32 and the outer circumferential refrigerant flow path 37 are thus connected to the respective different refrigerant cooling devices, and the refrigerant is separately supplied. Consequently, the temperatures of the central portion 31 and the outer circumferential portion 35 of the cooling base 30 are separately controlled, and the temperatures of the wafer placement surface 20a and the focus ring placement surface 25a are separately controlled. The cooling base 30 also functions as a radio frequency (RF) electrode for generating plasma and is connected to a RF power supply, not illustrated, with a power supply terminal 70 interposed therebetween. The power supply terminal 70 is joined to a lower surface of the cooling base 30.

The cooling base 30 includes the coupler 40 outside an outermost edge of the central refrigerant flow path 32 and inside an innermost edge of the outer circumferential refrigerant flow path 37. The coupler 40 has an upward groove 42 that opens from an upper surface and a downward groove 44 that opens from a lower surface. The upward groove 42 is formed at a position adjacent to the central refrigerant flow path 32 (that is, inside the downward groove 44) and has an annular shape that extends from the upper surface of the cooling base 30 to a bottom surface 42b that is flush with or lower than a bottom surface 32b of the central refrigerant flow path 32 and a bottom surface 37b of the outer circumferential refrigerant flow path 37. The downward groove 44 is formed at a position adjacent to the outer circumferential refrigerant flow path 37 (that is, outside the upward groove 42) and has an annular shape that extends from the lower surface of the cooling base 30 to a ceiling surface 44c that is flush with or higher than a ceiling surface 32c of the central refrigerant flow path 32 and a ceiling surface 37c of the outer circumferential refrigerant flow path 37. According to the present embodiment, the central portion 31 is a portion of the cooling base 30 inside an inner edge of the upward groove 42, the outer circumferential portion 35 is a portion outside an outer edge of the downward groove 44, and the coupler 40 is a portion therebetween.

The MMC that is used for the cooling base 30 preferably has a thermal expansion coefficient close to those of a ceramic material that is used for the central ceramic base 20 and a ceramic material that is used for the outer circumferential ceramic base 25. Examples of the MMC include a material containing Si, SiC and Ti and a material obtained by immersing Al and/or Si in a SiC porous body. The material containing Si, SiC and Ti is referred to as SiSiCTi. A material obtained by immersing Al in a SiC porous body is referred to as AlSiC. A material obtained by immersing Si in a SiC porous body is referred to as SiSiC. In the case where the central ceramic base 20 and the outer circumferential ceramic base 25 are alumna bases, the MMC that is used for the cooling base 30 is preferably AlSiC or SiSiCTi. In the case where the central ceramic base 20 and the outer circumferential ceramic base 25 are aluminum nitride bases, the MMC that is used for the cooling base 30 is preferably AlSiC or SiSiC.

The central joining layer 50 is a metal joining layer that joins the lower surface of the central ceramic base 20 and an upper surface of the central portion 31 of the cooling base 30 to each other. The central joining layer 50 may be a layer composed of, for example, a solder or brazing metal material. The central joining layer 50 may be a layer composed of, for example, an Al—Mg joining material or an Al—Si—Mg joining material. The thickness of the central joining layer 50 is preferably, for example, about 100 μm. The central joining layer 50 is formed by, for example, TCB (Thermal compression bonding). TCB is a known method in which a metal joining material is put between two members to be joined, and the two members are compressed and joined with the two members heated to a temperature equal to or lower than the solidus temperature of the metal joining material.

The outer circumferential joining layer 55 is a metal joining layer that joins the lower surface of the outer circumferential ceramic base 25 and an upper surface of the outer circumferential portion 35 of the cooling base 30 to each other. The outer circumferential joining layer 55 may be a layer composed of, for example, a solder or brazing metal material. The outer circumferential joining layer 55 may be a layer composed of, for example, an Al—Mg joining material or an Al—Si—Mg joining material. The thickness of the outer circumferential joining layer 55 is preferably, for example, about 100 μm. The outer circumferential joining layer 55 is formed by, for example, TCB.

An example of the use of the wafer placement table 10 will now be described. The wafer W is first placed on the wafer placement surface 20a with the wafer placement table 10 installed in a chamber not illustrated, and the focus ring FR is placed on the focus ring placement surface 25a. The focus ring FR has a step along the inner circumference of an upper end portion so as not to interfere with the wafer W. In this state, a direct voltage is applied to the central electrode 22 and the outer circumferential electrode 27, the wafer W is attracted to the wafer placement surface 20a, and the focus ring FR is attracted to the focus ring placement surface 25a. Settings are adjusted such that the interior of the chamber becomes a vacuum atmosphere (or a decompression atmosphere), a RF voltage is applied to the cooling base 30 while process gas is supplied from a shower head that is disposed on a ceiling portion in the chamber and that is not illustrated. Plasma is then generated between the wafer W and the shower head. A CVD film is formed or etching is performed on the wafer W by using the plasma.

While the wafer W is processed by using the plasma, refrigerant is separately supplied to the central refrigerant flow path 32 from the central refrigerant cooling device and to the outer circumferential refrigerant flow path 37 from the outer circumferential refrigerant cooling device. Consequently, the temperatures of the wafer placement surface 20a that is located above the central refrigerant flow path 32 and the focus ring placement surface 25a that is located above the outer circumferential refrigerant flow path 37 are separately controlled (cooling). At this time, as for the cooling base 30, the central portion 31 that has the central refrigerant flow path 32 and the outer circumferential portion 35 that has the outer circumferential refrigerant flow path 37 are coupled with each other by using the coupler 40, and accordingly, heat is transferred between the central portion 31 and the outer circumferential portion 35 via the coupler 40. FIG. 4 conceptually illustrates the heat-transfer path X in the coupler 40 (a portion that is surrounded by a one-dot chain line) between the central portion 31 and the outer circumferential portion 35 (see a dashed line). The heat-transfer path X includes a path that extends in the horizontal direction from a lower outer edge portion of the central portion 31 along the bottom (a portion below the bottom surface 42b) of the upward groove 42, a path that extends in the up-down direction along a wall between the upward groove 42 and the downward groove 44, a path that extends in the horizontal direction along the ceiling (a portion above the ceiling surface 44c) of the downward groove 44, and a path that extends to an upper inner edge portion of the outer circumferential portion 35 (the directions may be opposite directions). If the downward groove 44 is omitted, then the heat-transfer path in the coupler 40 is only the path that extends in the horizontal direction along the bottom of the upward groove 42 and is short. If a difference in temperature between the central portion 31 and the outer circumferential portion 35 increases in this state (for example, if a difference in temperature between the refrigerant that is supplied to the central refrigerant flow path 32 and the refrigerant that is supplied to the outer circumferential refrigerant flow path 37 increases), then the temperature gradient of the coupler 40 increases, and there is a possibility that the coupler 40 is damaged due to a thermal stress. As for the wafer placement table 10 according to the present embodiment, however, the heat-transfer path X in the coupler 40 includes not only the paths that extend in the horizontal direction but also the path that extends in the up-down direction as described above and is long. Accordingly, the temperature gradient of the coupler 40 does not become too large even when the difference in temperature between the central portion 31 and the outer circumferential portion 35 increases, and damage due to a thermal stress is unlikely to occur.

The wafer placement table 10 described above has not only the upward groove 42 but also the downward groove 44, the ceiling surface 44c of the downward groove 44 is higher than the bottom surface 42b of the upward groove 42, and accordingly, damage due to a thermal stress is reduced as described above. The wafer placement table 10 has the integrated body and is accordingly easier to handle than in the case where the central portion 31 and the outer circumferential portion 35 have separated bodies.

The refrigerant is separately supplied to the central refrigerant flow path 32 and the outer circumferential refrigerant flow path 37, and accordingly, the temperatures of the wafer placement surface 20a that is located above the central refrigerant flow path 32 and the focus ring placement surface 25a that is located above the outer circumferential refrigerant flow path 37 can be separately controlled.

In addition, the upward groove 42 is formed next to the central refrigerant flow path 32, and the bottom surface 42b of the upward groove 42 is lower than the bottom surface 32b of the central refrigerant flow path 32 and the bottom surface 37b of the outer circumferential refrigerant flow path 37. With this structure, the bottom surface 42b of the upward groove 42 is located at a portion that is cooled by the refrigerant and that has a stable temperature, and accordingly, damage due to a thermal stress is more effectively reduced than in the case where the bottom surface 42b of the upward groove 42 is located at a portion higher than that.

In addition, the coupler 40 has the single upward groove 42 and the single downward groove 44, and the number of the upward groove and the number of the downward groove are minimized. Accordingly, process costs can be inhibited from increasing. A portion that cannot have the refrigerant flow paths 32 and 37 can be reduced, and accordingly, the degree of freedom of the arrangement of the refrigerant flow paths 32 and 37 can be increased.

The cooling base 30 is composed of the MMC that has a linear thermal expansion coefficient close to those of the ceramic material of which the central ceramic base 20 is composed and the ceramic material of which the outer circumferential ceramic base 25 is composed, and accordingly, a metal joining layer can be used instead of a resin joining layer when the central ceramic base 20 and the cooling base 30 is joined to each other, and the outer circumferential ceramic base 25 and the cooling base 30 is joined to each other. The thermal conductivity of the metal joining layer is higher than that of the resin joining layer, and accordingly, the ability to remove heat required for the case where a wafer is processed by using high power plasma can be acquired. The MMC is conductive.

Accordingly, the cooling base 30 can be used as a RF electrode, and it is not necessary to prepare an additional RF electrode. According to the present embodiment, the central joining layer 50 and the outer circumferential joining layer 55 are composed of metal, and accordingly, these can be used as a RF electrode.

It goes without saying that the present invention is not limited to the embodiment described above and can be carried out in various aspects within the technical scope of the present invention.

Figure 5:
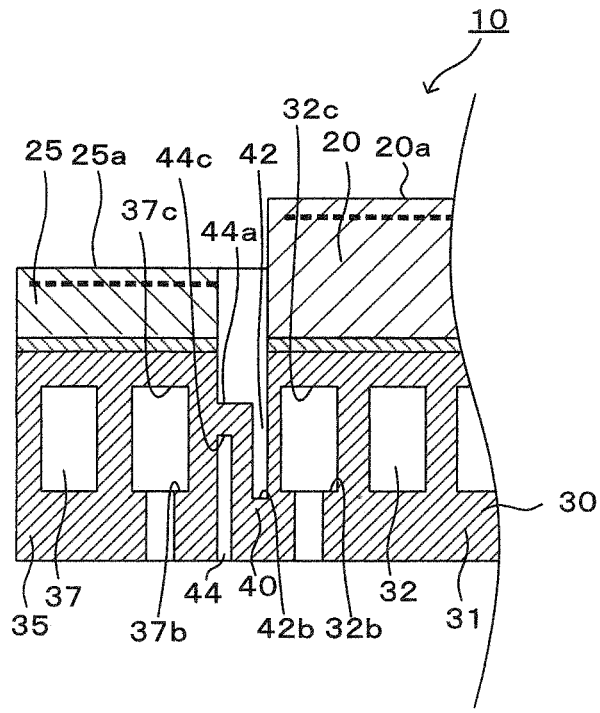
FIG. 5 is a partial sectional view of another example of the wafer placement table 10.

For example, according to the embodiment described above, the outer circumferential ceramic base 25 is joined also to an upper surface of the ceiling above the downward groove 44 but may not be joined to the upper surface of the ceiling above the downward groove 44. In this case, as illustrated in FIG. 5, the upper surface of the ceiling above the downward groove 44 may be a lowered surface 44a that is lower than the upper surface of the outer circumferential portion 35. The lowered surface 44a may be lower than, flush with, or higher than the ceiling surface (the ceiling surface 37c) of the refrigerant flow path (the outer circumferential refrigerant flow path 37) adjacent to the downward groove 44.

Figure 6:
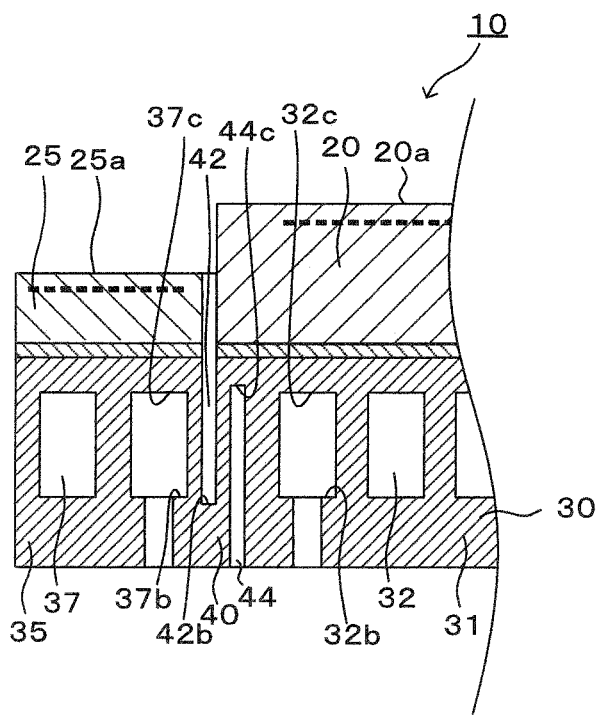
FIG. 6 is a partial sectional view of another example of the wafer placement table 10.

According to the embodiment described above, the upward groove 42 is formed inside the downward groove 44. As illustrated in FIG. 6, however, the upward groove 42 may be formed outside the downward groove 44. In this case, the central portion 31 is a portion of the cooling base 30 inside an inner edge of the downward groove 44, the outer circumferential portion 35 is a portion outside an outer edge of the upward groove 42, and the coupler 40 is a portion therebetween. Also, in this way, the same effects as those according to the embodiment described above can be achieved. In the case where the upper surface of the central portion 31 is used while being heated to a temperature higher than that of the upper surface of the outer circumferential portion 35, the upward groove 42 may be formed inside the downward groove 44. In the case where the upper surface of the outer circumferential portion 35 is used while being heated to a temperature higher than that of the upper surface of the central portion 31, the upward groove 42 may be formed outside the downward groove 44. This enables a difference in temperature between both ends of the heat-transfer path in the coupler 40 to be reduced. In FIG. 6, the central ceramic base 20 may not be joined to the upper surface of the ceiling above the downward groove 44. In this case, the upper surface of the ceiling above the downward groove 44 may be a lowered surface that is lower than the upper surface of the central portion 31. The lowered surface may be lower than, flush with, or higher than the ceiling surface (the ceiling surface 32c) of the refrigerant flow path (the central refrigerant flow path 32) adjacent to the downward groove 44.

Figure 7:
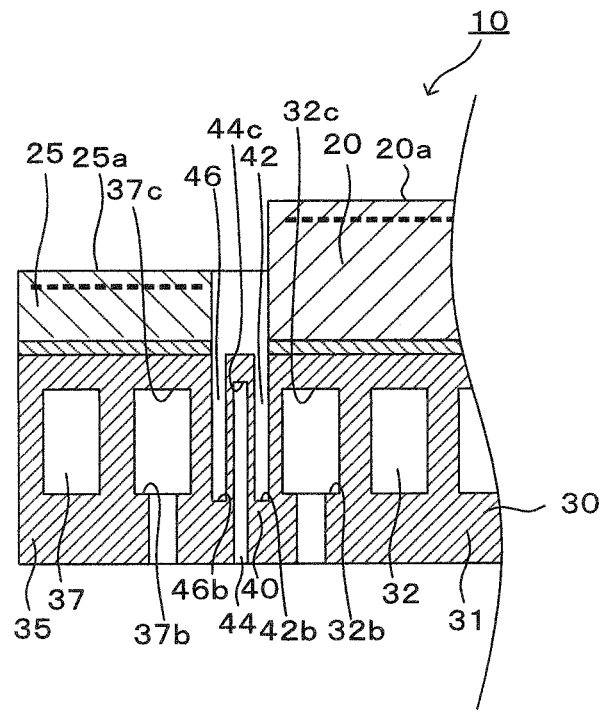
FIG. 7 is a partial sectional view of another example of the wafer placement table 10.
Figure 8:
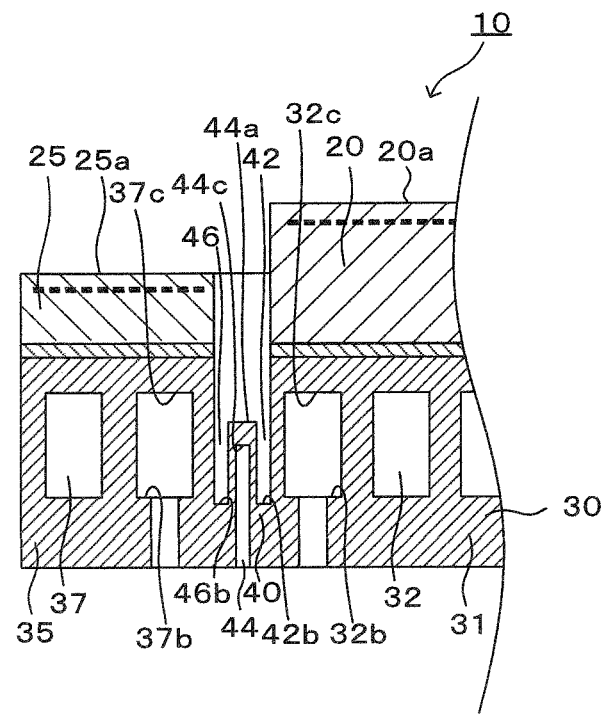
FIG. 8 is a partial sectional view of another example of the wafer placement table 10.

According to the embodiment described above, the coupler 40 has the single upward groove and the single downward groove. However, the number of the upward groove, the number of the downward groove, or both may be increased to two or more. In this case, the one or two upward grooves and the one or two downward grooves are preferably alternately arranged. For example, as illustrated in FIG. 7, an upward groove 46 is added outside the downward groove 44, and the two upward grooves (the upward grooves 42 and 46) and the single downward groove (the downward groove 44) may be formed. In this case, the central portion 31 is a portion inside an inner edge of the upward groove 42, the outer circumferential portion 35 is a portion outside an outer edge of the upward groove 46, and the coupler 40 is a portion therebetween. This enables the heat-transfer path in the coupler 40 to be longer than in the case where the number of the upward groove is one, and the number of the downward groove is one and enables a thermal stress that is applied to the coupler 40 to be reduced. The upward grooves are formed next to both of the central refrigerant flow path 32 and the outer circumferential refrigerant flow path 37, and accordingly, the central portion 31 and the outer circumferential portion 35 can be coupled with each other at a lower portion that is cooled by the refrigerant and that has a relatively stable temperature unlike the case where a downward groove is formed next to one of these or both. For this reason, damage due to a thermal stress can be further reduced. When a bottom surface 46b of the upward groove 46 is flush with or lower than the bottom surface 32b of the central refrigerant flow path 32 and the bottom surface 37b of the outer circumferential refrigerant flow path 37, the bottom surface 46b of the upward groove 46 is located at a portion that has a more stable temperature, and accordingly, damage due to a thermal stress is more unlikely to occur. As illustrated in FIG. 8, the upper surface of the ceiling above the downward groove 44 may be the lowered surface 44a that is lower than the upper surface of the central portion 31, the upper surface of the outer circumferential portion 35, or both. The lowered surface 44a may be lower than, flush with, or higher than the ceiling surface of the central refrigerant flow path 32, the ceiling surface of the outer circumferential refrigerant flow path 37, or both.

According to the embodiment described above, the upper surface of the central portion 31 and the upper surface of the outer circumferential portion 35 are flush with each other. However, the upper surface of the central portion 31 may be high or the upper surface of the outer circumferential portion 35 may be high. The bottom surface 32b of the central refrigerant flow path 32 and the bottom surface 37b of the outer circumferential refrigerant flow path 37 are flush with each other. However, the bottom surface 32b of the central refrigerant flow path 32 may be high, or the bottom surface 37b of the outer circumferential refrigerant flow path 37 may be high. The ceiling surface 32c of the central refrigerant flow path 32 and the ceiling surface 37c of the outer circumferential refrigerant flow path 37 are flush with each other. However, the ceiling surface 32c of the central refrigerant flow path 32 may be high, and the ceiling surface 37c of the outer circumferential refrigerant flow path 37 may be high.

According to the embodiment described above, the bottom surface 42b of the upward groove 42 is flush with or lower than both of the bottom surface 32b of the central refrigerant flow path 32 and the bottom surface 37b of the outer circumferential refrigerant flow path 37. However, this may not be satisfied. Even in this case, the bottom surface 42b of the upward groove 42 is preferably lower than the ceiling surface of the central refrigerant flow path 32 or the outer circumferential refrigerant flow path 37 adjacent to the upward groove 42 and is preferably flush with or lower than the bottom surface of the refrigerant flow path adjacent to the upward groove 42. The same is true for the bottom surface 46b of the upward groove 46.

According to the embodiment described above, the ceiling surface 44c of the downward groove 44 is flush with or higher than both of the ceiling surface 32c of the central refrigerant flow path 32 and the ceiling surface 37c of the outer circumferential refrigerant flow path 37. However, this may not be satisfied. Even in this case, the ceiling surface 44c of the downward groove 44 is preferably higher than the bottom surface of the central refrigerant flow path 32 or the outer circumferential refrigerant flow path 37 adjacent to the downward groove 44 and is preferably flush with or higher than the ceiling surface of the refrigerant flow path adjacent to the downward groove 44.

According to the embodiment described above, the cooling base 30 is composed of the MMC but may be composed of, for example, a metal material such as molybdenum, tungsten, aluminum, aluminum alloy, or stainless steel (a SUS material) or may be composed of a resin material. Among these, the metal material is conductive. Accordingly, when the cooling base 30 is composed of the metal material, the cooling base 30 can be used as a RF electrode. A metal material that less thermally expands such as molybdenum or tungsten has a linear thermal expansion coefficient close to those of the ceramic material of which the central ceramic base 20 is composed and the ceramic material of which the outer circumferential ceramic base 25 is composed. Accordingly, when the cooling base 30 is composed of the metal material that less thermally expands, metal joining layers can be used as the central joining layer 50 and the outer circumferential joining layer 55 instead of resin joining layers. The cooling base 30 may be composed of the metal material as described above or resin. The wafer placement table according to the present invention can reduce damage due to a thermal stress and is accordingly particularly effective for the case where a fragile material such as the MMC is used for the cooling base 30.

According to the embodiment described above, the central ceramic base 20 contains the central electrode 22 for attracting the wafer. However, in addition to this or instead of this, a RF electrode for generating plasma may be contained. This is also referred to as a central RF electrode.

In this case, a radio frequency power supply is connected to the central RF electrode. The central ceramic base 20 may contain a heater electrode (a resistance heating element). This is also referred to as a central heater electrode.

According to the embodiment described above, the outer circumferential ceramic base 25 contains the outer circumferential electrode 27 for attracting the focus ring. However, in addition to this or instead of this, a RF electrode for generating plasma may be contained. This is also referred to as an outer circumferential RF electrode. In this case, a radio frequency power supply is connected to the outer circumferential RF electrode. The outer circumferential ceramic base 25 may contain a heater electrode (a resistance heating element). This is also referred to as an outer circumferential heater electrode. The outer circumferential heater electrode may control temperature separately from the central heater electrode. This enables the temperatures of the wafer placement surface 20a and the focus ring placement surface 25a to be controlled with more precision.

According to the embodiment described above, the central refrigerant flow path 32 has a spiral shape that extends from the inlet 33 to the outlet 34. However, a planer shape of the central refrigerant flow path 32 is not particularly limited. Multiple central refrigerant flow paths 32 may be provided. The central refrigerant flow path 32 has a rectangular section. However, a sectional shape of the central refrigerant flow path 32 is not particularly limited. For example, an upper corner portion in the section of the central refrigerant flow path 32 may has a R surface. This prevents a crack starting from the upper corner portion in the section of the central refrigerant flow path 32 from occurring. The same is true for the outer circumferential refrigerant flow path 37.

Figure 9:
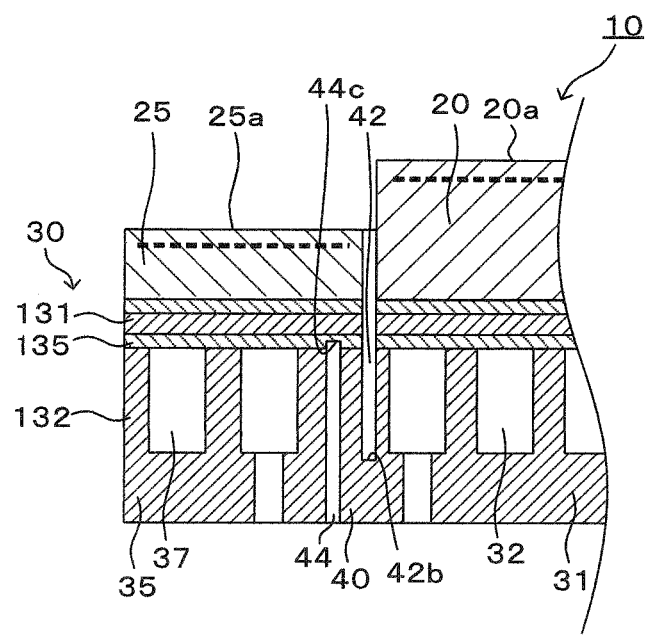
FIG. 9 is a partial sectional view of another example of the wafer placement table 10.

In the description according to the embodiment described above, the cooling base 30 is a member. As illustrated in FIG. 9, however, an upper member 131 and a lower member 132 may be joined to each other by using a joining layer 135. The upper member 131 and the lower member 132 have a shape obtained by cutting the cooling base 30 along a horizontal plane containing the ceiling surface of the refrigerant flow path 32 into two pieces. The joining layer 135 is preferably a metal joining layer. The cooling base 30 may have a structure that includes three or more members that are joined to each other.

According to the embodiment described above, a hole that extends through the wafer placement table 10 from the lower surface of the cooling base 30 to the wafer placement surface 20a may be formed. Example of the hole include a gas supply hole for supplying heat-transfer gas (for example, He gas) to a back surface of the wafer W and a lift pin hole through which a lift pin that lifts and lowers the wafer W with respect to the wafer placement surface 20a extends. The heat-transfer gas is supplied to spaces that are defined by a large number of small projections (that support the wafer W) that are disposed on the wafer placement surface 20a and that are not illustrated and the wafer W. For example, in the case where the wafer W is supported by three lift pins, lift pin holes are formed at three positions.

The present application claims priority from Japanese Patent Application No. 2021-181625, filed on Nov. 8, 2021, the entire contents of which are incorporated herein by reference.

What is claimed is:

1. A wafer placement table comprising:
   a central ceramic base that has an upper surface including a wafer placement surface and that contains an electrode;
   an outer circumferential ceramic base that has an upper surface including a focus ring placement surface, that is disposed on an outer circumference of the central ceramic base, that is separated from the central ceramic base, and that has an annular shape; and
   a cooling base that includes a central portion that is joined to a lower surface of the central ceramic base, an outer circumferential portion that is joined to a lower surface of the outer circumferential ceramic base, and a coupler that couples the central portion and the outer circumferential portion with each other,
   wherein the cooling base has a central refrigerant flow path that is formed in the central portion and an outer circumferential refrigerant flow path that is formed in the outer circumferential portion,
   wherein the coupler is formed outside an outermost edge of the central refrigerant flow path and inside an innermost edge of the outer circumferential refrigerant flow path, and has one or more upward grooves that open from an upper surface, and that have an annular shape, and has one or more downward grooves that open from a lower surface, that have a ceiling surface higher than a bottom surface of the one or more upward grooves, and that have an annular shape, and
   wherein the cooling base comprises a metal matrix composite material (MMC).

2. The wafer placement table according to claim 1, wherein refrigerant is separately supplied to the central refrigerant flow path and the outer circumferential refrigerant flow path.

3. The wafer placement table according to claim 1, wherein the one or more upward grooves are formed next to the central refrigerant flow path, the outer circumferential refrigerant flow path, or both, and the bottom surface of the one or more upward grooves is flush with or lower than a bottom surface of the central refrigerant flow path and a bottom surface of the outer circumferential refrigerant flow path.

4. The wafer placement table according to claim 1, wherein the coupler has two of the upward grooves and one of the downward grooves, and the upward grooves and the downward groove are alternately arranged.

5. The wafer placement table according to claim 1, wherein the metal matrix composite material (MMC) is selected from the group consisting of SiSiCTi, AlSiC, and SiSiC.

6. The wafer placement table according to claim 1, wherein the coupler has two or more upward grooves that open from an upper surface.

* * * * *